(12) United States Patent
 Hronik

(10) Patent No.: US 8,265,219 B1
(45) Date of Patent: *Sep. 11, 2012

(54) METHOD AND APPARATUS FOR FAST PLL INITIALIZATION

(75) Inventor: Stanley Hronik, Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 1098 days.

This patent is subject to a terminal disclaimer.

(21) Appl. No.: 11/428,071

(22) Filed: Jun. 30, 2006

Related U.S. Application Data

(63) Continuation of application No. 11/395,602, filed on Mar. 31, 2006, now abandoned.

(60) Provisional application No. 60/698,320, filed on Jul. 12, 2005.

(51) Int. Cl.
 *H03D 3/24* (2006.01)
(52) U.S. Cl. ......... 375/376; 375/373; 375/371; 375/354
(58) Field of Classification Search .................. 375/376, 375/373, 371, 354; 370/503; 714/12
 See application file for complete search history.

(56) References Cited

U.S. PATENT DOCUMENTS

| | | | | |
|---|---|---|---|---|
| 5,230,013 A * | 7/1993 | Hanke et al. | ............ | 375/373 |
| 5,319,680 A * | 6/1994 | Port et al. | ............ | 375/375 |
| 5,487,093 A * | 1/1996 | Adresen et al. | ............ | 375/376 |
| 5,696,468 A * | 12/1997 | Nise | ............ | 331/14 |
| 5,757,240 A * | 5/1998 | Boerstler et al. | ............ | 331/34 |
| 6,043,717 A * | 3/2000 | Kurd | ............ | 331/17 |
| 6,259,293 B1 * | 7/2001 | Hayase et al. | ............ | 327/276 |
| 6,393,081 B1 * | 5/2002 | Whetsel | ............ | 375/354 |
| 6,424,229 B1 * | 7/2002 | Justice et al. | ............ | 331/4 |
| 7,130,284 B2 * | 10/2006 | Lee et al. | ............ | 370/331 |
| 7,146,143 B2 * | 12/2006 | Oosawa et al. | ............ | 455/245.1 |
| 7,148,758 B1 * | 12/2006 | Ross et al. | ............ | 331/17 |
| 7,233,183 B1 * | 6/2007 | Sancheti | ............ | 327/158 |
| 7,346,133 B2 * | 3/2008 | Tatem, Jr. | ............ | 375/344 |
| 2002/0003453 A1 * | 1/2002 | Segawa et al. | ............ | 331/14 |
| 2002/0176520 A1 * | 11/2002 | Heegard et al. | ............ | 375/327 |
| 2003/0155981 A1 * | 8/2003 | Dey | ............ | 331/16 |
| 2005/0134336 A1 * | 6/2005 | Goldblatt et al. | ............ | 327/156 |
| 2005/0253658 A1 * | 11/2005 | Maeda et al. | ............ | 331/2 |
| 2006/0034377 A1 * | 2/2006 | Chan | ............ | 375/257 |
| 2006/0227914 A1 * | 10/2006 | Partovi et al. | ............ | 375/355 |
| 2006/0284688 A1 * | 12/2006 | Miki | ............ | 331/16 |
| 2006/0284693 A1 * | 12/2006 | Nelson | ............ | 331/57 |
| 2006/0284746 A1 * | 12/2006 | Huang et al. | ............ | 341/50 |
| 2009/0135979 A1 * | 5/2009 | Paille | ............ | 375/376 |

* cited by examiner

*Primary Examiner* — Shuwang Liu
*Assistant Examiner* — Helene Tayong
(74) *Attorney, Agent, or Firm* — Heimlich Law, PC; Alan Heimlich, Esq.

(57) ABSTRACT

A method and apparatus for fast PLL initialization have been disclosed where control of a VCO is based on a selected control signal which is based upon either a comparison signal or a prespecified signal.

7 Claims, 7 Drawing Sheets

METHOD AND APPARATUS FOR FAST PLL INITIALIZATION

RELATED APPLICATION

This patent application claims priority of U.S. Provisional Application Ser. No. 60/698,320 filed 12 Jul. 2005 titled "Method and Apparatus for Parameter Adjustment, Testing, and Configuration", which is hereby incorporated herein by reference. This patent application claims priority of U.S. application Ser. No. 11/395,602 filed 31 Mar. 2006 titled "Method and Apparatus for Parameter Adjustment, Testing, and Configuration", which is hereby incorporated herein by reference.

FIELD OF THE INVENTION

The present invention pertains to devices. More particularly, the present invention relates to a method and apparatus for fast phase locked loop (PLL) initialization. As used in this application "PLL" refers not only to a phase locked loop, but in general, to locked loops based on any number of approaches or techniques. For example, a delay locked loop (DLL), a frequency locked loop (FLL), etc. PLL is thus used as a generic term, for ease of discussion, to refer to any locked loop circuit. That is, references to PLLs includes DLLs, FLLs, etc. in applicable situations as one of skill in the art will recognize.

BACKGROUND OF THE INVENTION

As system speeds increase, the use of PLL and DLL devices is becoming prevalent throughout the system. Some of the uses of these devices include clock distribution, clock/data recovery, aligning data and clock on parallel interfaces, and providing effective data capture on serial interfaces.

PLLs inherently require time to "acquire lock" whenever the PLL is reset, powered up, or undergoes a rapid input frequency change. This may present a problem.

Within systems, it is possible for every interface, or bus to have a PLL device on the input, output or both. When systems are interconnected, it is likely that there will be several layers of PLLs connected, each relying upon the previous PLL for its input. This may present a problem.

For example, FIG. 3, generally at 300, shows a simplified block diagram of a system. The "Master system clock" (such as at 302) could be a simple PLL and crystal oscillator combined to generate a clock across a board or larger system. The "subsystem clock" (such as at 304) could be something like a processor or ASIC (application specific integrated circuit) that receives the Master system clock and generates one of its own from that clock through a PLL. The ASIC may have a memory bus that uses a source synchronous clock which is sent to a memory device (Remote system clock, such as at 306) where it enters a PLL and the PLL regenerates the clock for local usage and data capture on the bus. Other systems may extend for several more layers.

Such systems of interconnecting clocks (as illustrated generally in FIG. 3) with each clock relying upon the previous clock for input is in usage. The use of PLLs on interfaces is becoming more common as speeds increase and precise timing is required. PLLs upon power up, reset or a frequency change require a "lock time" to acquire the new frequency and stabilize the PLL. The PLL must search for its final operating frequency and then perform phase corrections until final lock is achieved. For example, as shown in FIG. 3, the Master system clock (such as at 302) is required to first achieve stability before the Subsystem clock (such as at 304) may acquire stability. During the Master system clock (such as at 302) stabilization, the clock being sent to the Subsystem clock (such as at 304) is not stable, thus delaying the stabilization of the Subsystem clock (such as at 304). Further extending the problem to lower systems (e.g. systems further down the clock chain), the Remote system clock (such as at 306) is unable to achieve stabilization until both the Master system clock (such as at 302) and the Subsystem clock (such as at 304) have achieved stability (e.g. sequentially in order). The remote system clock (such as at 306) may have further problems because the subsystem clock (such as at 304) may have been operating at an extreme, undesired, or errant frequency during the stabilization process that may have upset the downstream remote system clock (such as at 304). This may result in the system being clocked by the remote system clock (such as at 306) operating improperly, operating outside design parameters, etc. This may present a problem.

The use of source synchronous clocks in high-speed systems may extend the number of layers of PLLs in a system to a very large number with each depending upon the previous for stability before it can acquire its own stability. This may present a problem.

Slow PLL lock time, as noted, may present problems. The use of multiple, cascaded PLLs may exacerbate the problems. For example, problems which may be caused by slow PLLs lock time include, but are not limited to, the following:

1) System boot time delay. After power up or reset, each PLL waits for lock and subsequent PLLs rely upon the previous PLL for lock before they can acquire their own lock. Boot times can become extensive.

2) Performing a frequency change with a PLL requires a PLL to undergo a new search and lock. For example, several situations that may require a frequency change include system testing and link failure where a new (such as lower or higher) frequency is needed.

3) A disconnected system may have no clock. A PLL with no input reference clock may produce an unstable or unknown output.

Thus slow PLL lock times may present a problem.

BRIEF DESCRIPTION OF THE DRAWINGS

The invention is illustrated by way of example and not limitation in the figures of the accompanying drawings in which.

DETAILED DESCRIPTION

In one embodiment of the invention, a technique for quickly bringing a PLL or DLL or FLL to a designated operating frequency upon power up, reset, etc. is disclosed.

In one embodiment of the invention, bringing a PLL quickly to an operating frequency allows a system to begin initialization and may decrease the "serialized locking" (and associated time) that is required in most systems where each PLL in a chain must lock before the next PLL can stabilize and lock.

In one embodiment of the invention, this technique for quickly setting an operating frequency may also be used for other purposes, such as, but not limited to, test clocks, to generate a local clock upon loss of an input clock, etc.

In one embodiment of the invention, a technique for quickly establishing system clocking stability upon initialization is disclosed.

In one embodiment of the invention, a technique for shortening the lock time for a PLL, to allow very rapid lock acquisition is disclosed.

In one embodiment of the invention, programming of the PLL frequency may be achieved. One embodiment of the invention may be used to program an initial value for the frequency. In PLLs where the final frequency is known, one embodiment of the invention may load a preset value that will bring the PLL as close to the frequency as possible for initialization, and then the PLL may make small adjustments to perform the final "lock". This quick bring up avoids the PLL searching for the final frequency and may reduce the lock time by up to orders of magnitude. Once the PLL has been programmed for the initial frequency, the final adjustments may consist of little more than a phase shift.

In one embodiment of the invention, the programming may be done by loading a register with a target value for the final frequency. The data in the register may be used to control the frequency of the VCO (voltage controlled oscillator) or other oscillator within the PLL. Once established at the target frequency, the program control may be released, allowing the PLL to utilize its feedback and input clocks to arrive at its final frequency and phase. In one embodiment of the invention, the register may be loaded by a serial data chain, a parallel bus, or by other means.

In one embodiment of the invention, it is possible to complete the programming in a series of stages, with both a crude adjustment to set the "ballpark" frequency, and a finer adjustment to set the more precise frequency. These techniques may be used independently or together and may extend to still finer adjustments. In situations where a PLL is used over a wide frequency range, the "ballpark" adjustment may be all that is needed to bring the PLL close to the final frequency. In other situations, for example, where the PLL operates in a very limited frequency range, the fine tuning may be all that is needed. Both may be used together for optimum performance.

Figure 4:
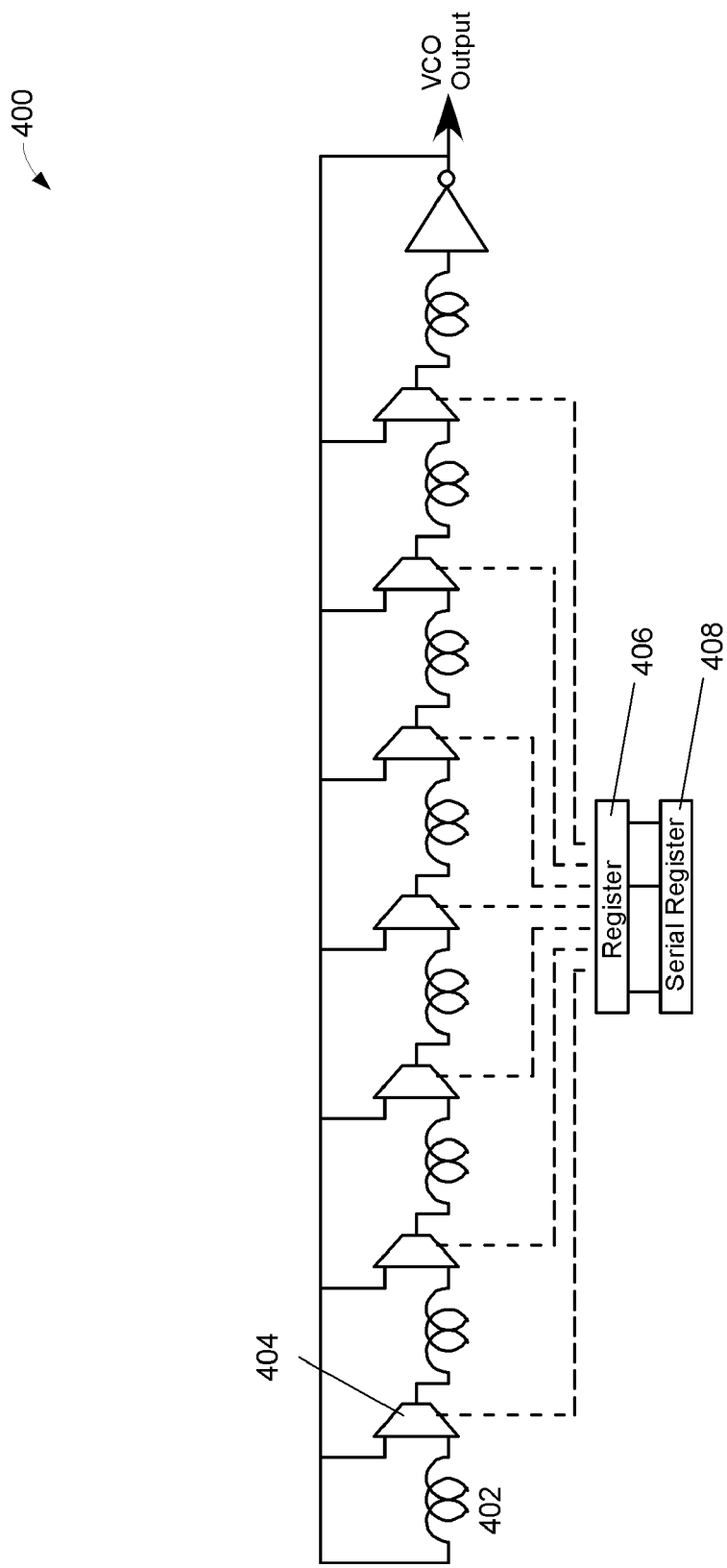
FIG. 4 illustrates one embodiment of the invention showing a VCO and register control that may be used in a PLL.

FIG. 4 illustrates one embodiment of the invention, generally at 400, showing a VCO and register control that may be used in a PLL. There are many ways of implementing the VCO, for example, there may be a series of transistors that form a voltage controlled delay line. In FIG. 4, the delays are represented by the inductors (such as that denoted at 402). A ring oscillator is formed by the inductors. In addition, there is a series of multiplexers (such as that denoted at 404) strategically placed within the ring to allow the length of the ring to be set. Ring oscillators may be designed to operate in a limited frequency range. Adding the multiplexers (such as that denoted at 404) allows setting the length of the ring, allowing a very wide range of selectable frequencies.

In FIG. 4, the programmable register (406) may be used to turn on and off the multiplexers (such as that denoted at 404) to set an initial ballpark frequency of the VCO. The register (406) may be programmed by an accompanying serial data chain (here, in FIG. 4, in the form of a Serial Register denoted at 408) or some other method, such as a parallel bus, etc. (not shown in FIG. 4). The initial setting may be set to optimize the length of the ring for the desired frequency. Upon a system reset or frequency change, a new setting may be quickly loaded, allowing very rapid frequency setting and short "lock" times.

In addition to the delay line adjustment as shown in one example in FIG. 4, PLLs and other devices that use VCOs may need to fine-tune the VCO output frequency. The multiplexing approach, for example, as shown in FIG. 4, allows approximate adjustments, however, it may not accurately target the final frequency, for example, because of course adjustments.

Some VCOs may be adjusted by manipulating a bias voltage on the VCO ring. By finely adjusting the voltage, the operating frequency of the ring can be minutely adjusted. In PLLs and other VCO control devices, the voltage may be adjusted by using a charge pump, a DAC (digital to analog converter), or some other approach of finely setting a voltage level.

In one embodiment of the invention, upon power up, reset, or other change in frequency, it may be desirable to precisely set the bias voltage on the VCO ring, so that it is almost immediately operating at the desired frequency.

Figure 5:
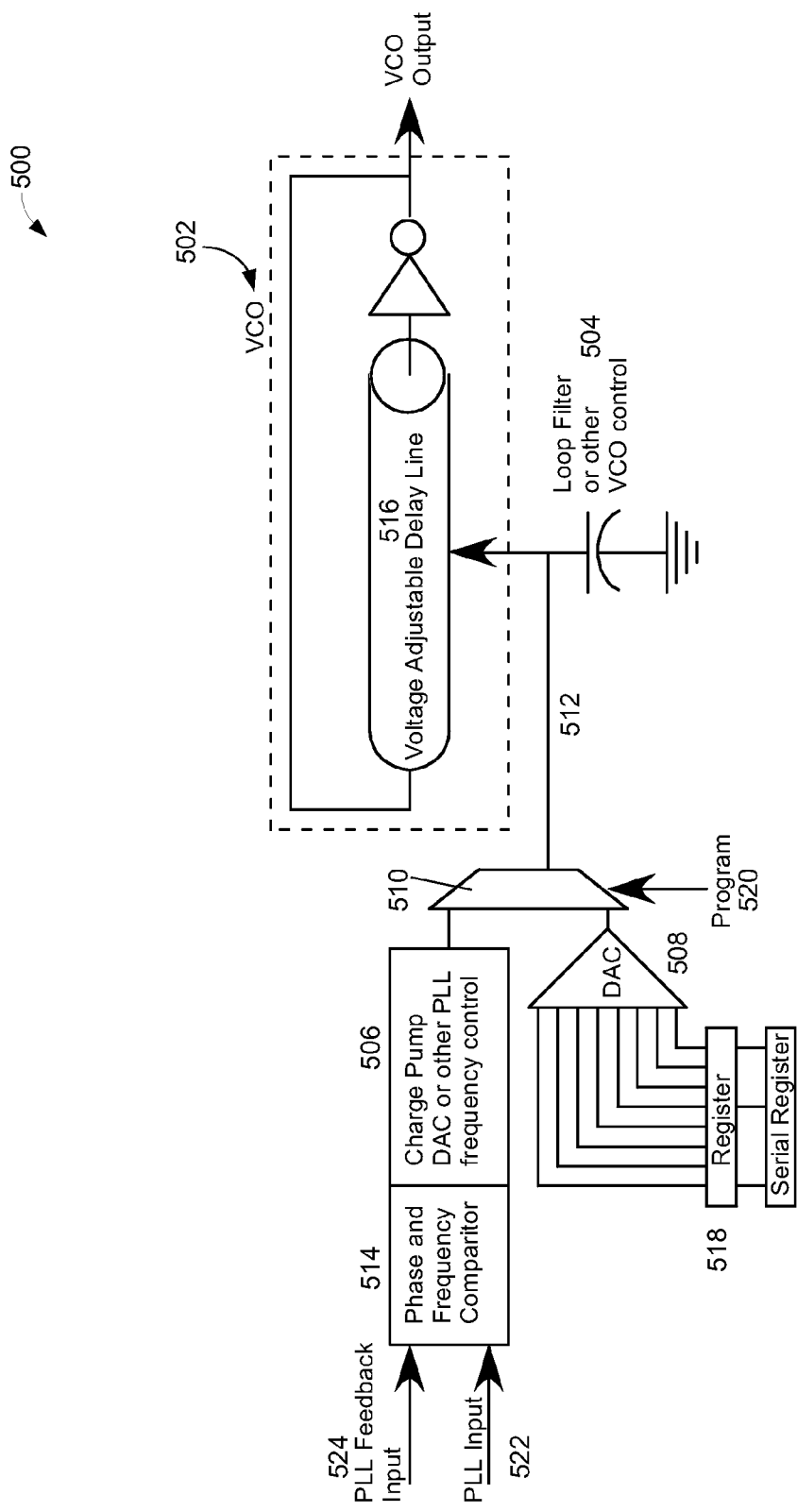
FIG. 5 illustrates one embodiment of the invention showing components of a PLL.

FIG. 5, illustrates one embodiment of the invention, generally at 500, showing components of a PLL including a VCO 502 (such as that shown as a ring oscillator similar to FIG. 4), a loop filter 504, a charge pump or DAC (506 or 508 depending on mux 510) that sets the voltage (as denoted on the line at 512) on the loop filter 504, and a phase/frequency comparator 514. The delay through the delay line (516) is precisely adjusted by setting the bias voltage 512 on the loop filter 504. Normally the voltage 512 is set by a charge pump or DAC 506 that is controlled by a feedback circuit and phase/frequency comparator 514. A multiplexer 510 has been added that allows a programmable register 518 to preset a voltage (output of DAC 508) on the loop filter 504 when multiplexer 510 selects (via Program 520) the DAC 508 output and establish a nominal ring operating frequency, prior to or regardless of any activity on the PLL Input 522 (also called a PLL Clock Input, or Clock Input, or Reference Signal) or PLL Feedback Input 524 (also called a VCO signal, or Signal Phase Locked to Reference Signal).

There are several advantages to the approach as illustrated in one embodiment of the invention, as shown in FIG. 5. For example, one advantage of using a programmable register is that a PLL or other device with an internal VCO may be precisely set or changed without requiring a search for lock. Once the frequency is set, and a loop filter or other controlling device has time to establish an initial charge/voltage, a switchover from the preset voltage to the charge pump may take place. If the VCO frequency is properly set, the PLL feedback should be approximately the same frequency as the input and feedback and the PLL will go quickly into lock.

In another embodiment of the present invention, in order to more quickly bring up a system, it may be desirable to initialize various PLLs in a system to start clocking prior to receiving a PLL input clock. For example, in the event that there was no input clock upon startup, or the clock was delayed until earlier stages successfully initialized themselves, the PLL phase comparator would not function properly and would attempt to pull the PLL to an incorrect value. The previous examples (such as that illustrated in one embodiment in FIG. 5) could be used to initiate and hold a clock frequency until some predetermined time. As described earlier in reference to PLL lock time, PLLs that have no input clock could be preset or could be held at an output frequency. Some examples of when this may be used are as follows:
1) During system initialization when clocks are not operational, there would be no need to wait for sequential bring up of the clocks. All clocks could be preset to the expected value, and turned on, allowing clocking through the entire system. The various portions of the system may then be released to quickly align the clocks.
2) During system testing a clock may be missing. Having the ability to generate a local clock allows system testing and verification of components that may otherwise be completely dead without a clock.

In one embodiment of the invention, the values for the programmable register (such as that illustrated in FIG. 5 at 518) settings could be discovered by sampling the actual working values in a functional system. Upon startup next time, the register could be programmed to load the last working values, providing very quick startup to the previous functional condition.

In other embodiments of the invention, other techniques of performing this "store and reuse" of the operating conditions could include, but are not to, for example, storing the data in an on board flash memory, other non-serial programming method, etc.

Figure 6:
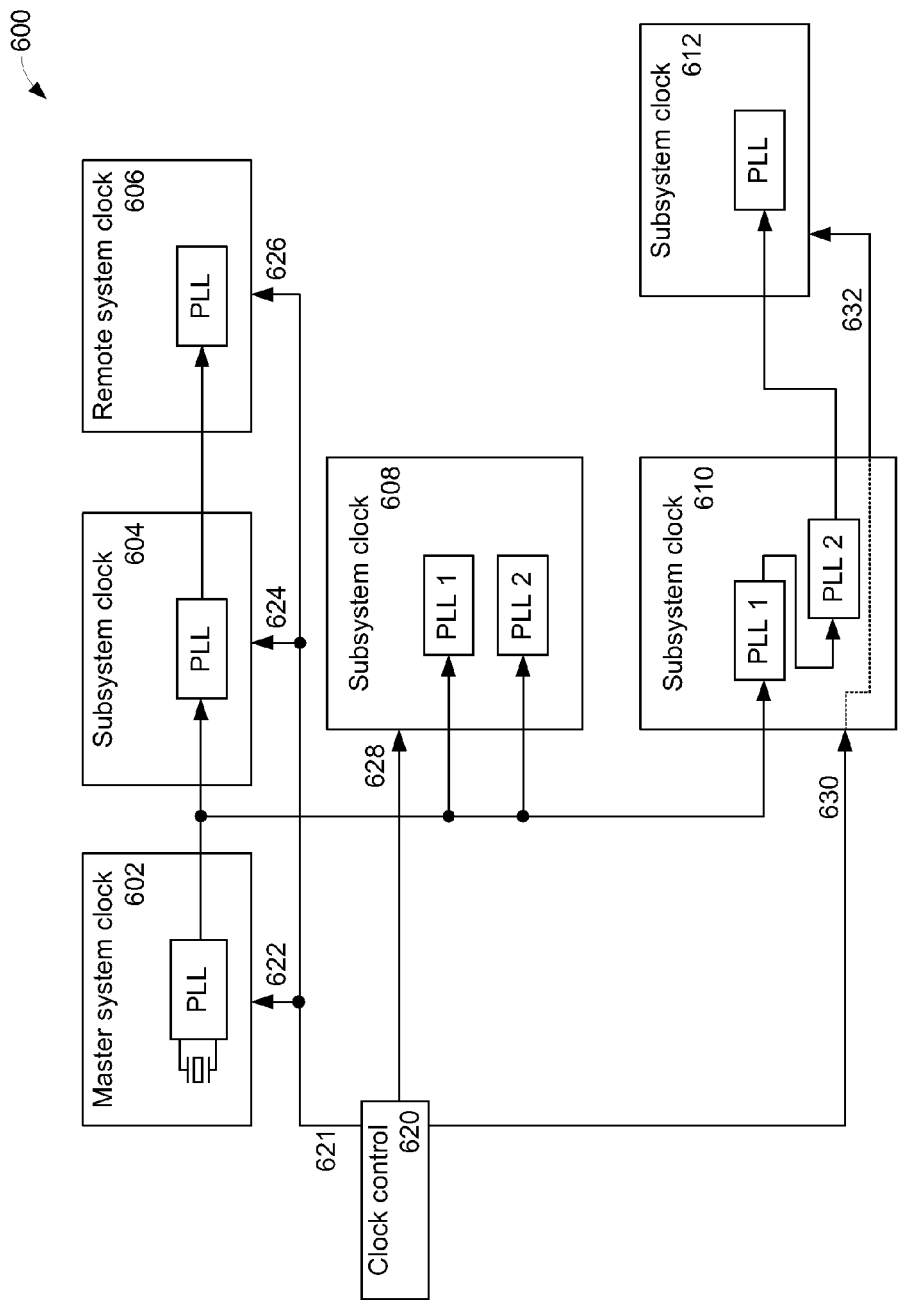
FIG. 6 illustrates one embodiment of the invention showing a system of interconnecting clocks with each clock relying upon the previous clock for input and a control network connecting the clocks.

FIG. 6 illustrates one embodiment of the invention, generally at 600, showing a system of interconnecting clocks with each clock relying upon the previous clock for input and a control network connecting the clocks. Master system clock 602 is sent to Subsystem clocks 604, 608, and 610. Subsystem clock 604 is sent to Remote system clock 606. Subsystem clock 608 has two PLLs, PLL 1 and PLL 2 which each receive the Master system clock 602. Subsystem clock 610 has two PLLs, PLL 1 and PLL 2, however in Subsystem clock 610 only PLL 1 receives the Master system clock 602. PLL 2 in Subsystem clock 610 receives its clock from PLL 1 in Subsystem clock 610. Subsystem clock 612 receives its PLL clock from PLL 2 of Subsystem clock 610.

Clock control 620 has a network of communications that connect via link 621 to Master clock 602 via link 622, Subsystem clock 604 via link 624, and Remote system clock 606 vial link 626. Clock control 620 also communicates with Subsystem clock 608 via link 628. Clock control 620 also communicates with Subsystem clock 610 via link 630. Subsystem clock 612 receives clock control 632 via a daisy chain connection (denoted as dashed lines) from Subsystem clock 610 which receives its clock control 632 directly from Clock control 620.

The Clock control links may be serial, parallel, or a combination. Additionally they may be a star configuration connection as shown for 621, 628, and 630 or a daisy chain as shown for link 632 to Subsystem clock 612.

The clock control will transmit via the respective links one or more messages to the clock systems (master, sub, and/or remote) for control. Each clock system will respond to the messages intended for it and adjust the operation of the one or more PLLs accordingly. These messages may be sent at any time, such as, but not limited to, power up, reset, frequency change needed at one or more PLLs, or dynamically during system operation based on such things as system timing, measurement of performance and/or errors, etc.

Figure 7:
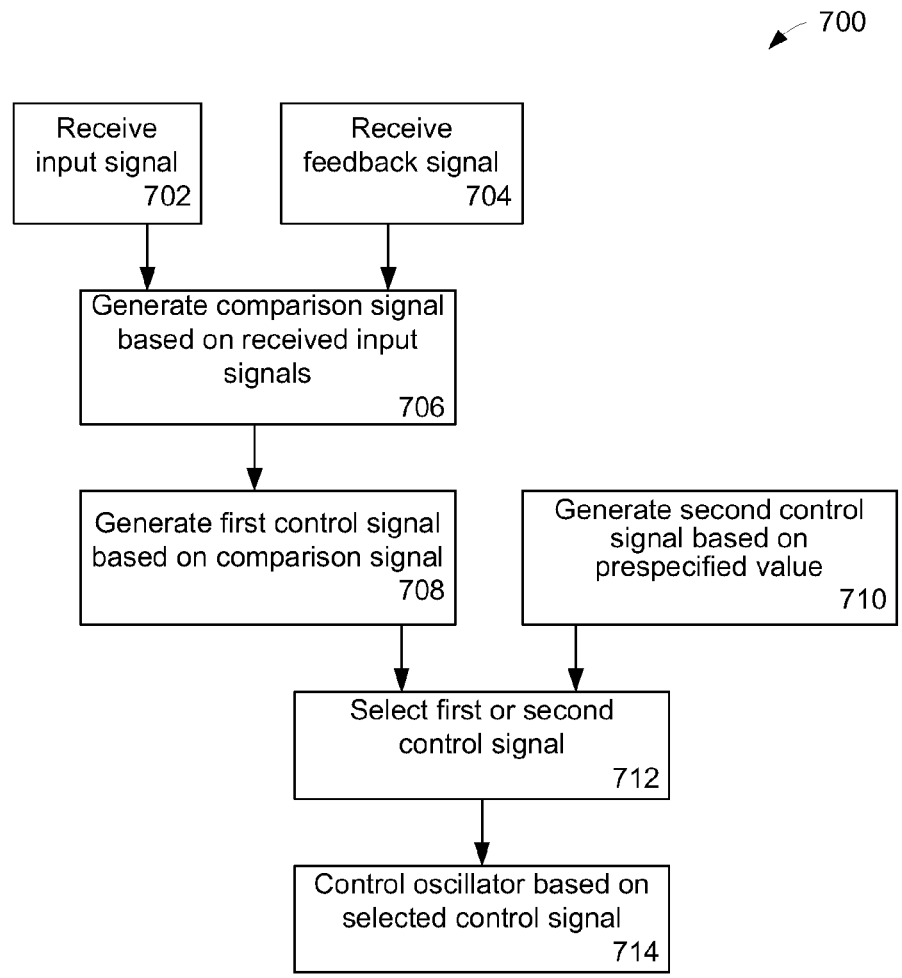
FIG. 7 illustrates one embodiment of the invention in block diagram form.

FIG. 7 illustrates one embodiment of the invention, generally at 700, in block diagram form. An input signal is received at 702. A feedback signal is received at 704. At 706 a comparison of the received input signal 702 and the received feedback signal 704 is made and a comparison signal is generated. At 708 the comparison signal from 706 is used to generate a first control signal. At 710 a second control signal is generated based on some prespecified value. At 712 the first control signal or the second control signal is selected. At 714 the selected control signal is used to control an oscillator.

One of skill in the art will appreciate that as illustrated in FIG. 7 many variations are possible. For example, the feedback signal received at 704 may represent any feedback from either the system output or an alternative clock input. The comparison signal generated at 706 which is based on the receive input signal 702 and receive feedback signal 704 may indicate a variety of conditions, for example, the comparison signal may indicate whether the receive input signal at 702 is valid, whether receive feedback signal 704 is present, or any of a number of combinations. At 708 the comparison signal from 706 is used to generate a first control signal that may indicate, for example, the functionality or an error quantity of the received input signal. One of skill in the art will also appreciate that the first control signal 708 could be used as an adjustment and the second control signal 710 could be used as a fixed value. That is, in another embodiment of the present invention the functionality of a block such as 712 is not either one input or the other but a combination of the inputs. In this way, the "selected control signal" (such as 712) is a combination of the first control signal (such as 708) and the second control signal (such as 710).

Thus in various embodiments of the present invention, while not limited to such, have shown:
1) Quick lock on a PLL or DLL, etc.
2) Quick locking of multiple, chained PLLs without waiting for sequential locking.
3) Setting an initial clock before the arrival of an input clock.
4) Providing test clocks. The clocks may be used when no other clock is present, or clock frequencies may be adjusted to test limits and border conditions.

For purposes of illustration, the above description tended to refer to VCOs, however, the invention is not so limited and one of skill in the art will appreciate that both analog controlled oscillators as well as digitally controlled oscillators (DCOs) may be used.

For purposes of illustration, the above description tended to refer to digital systems and PLLs, however, the invention is not so limited and one of skill in the art will appreciate that the techniques described may be applied to analog circuits as well.

For purposes of illustration, the above description tended to refer to hardware implementation of PLLs, however, the invention is not so limited and one of skill in the art will appreciate that some or all of the techniques described may be implemented in software especially if the sample rate is faster than the loop center frequency.

Thus a method and apparatus for fast PLL initialization have been described.

Figure 1:
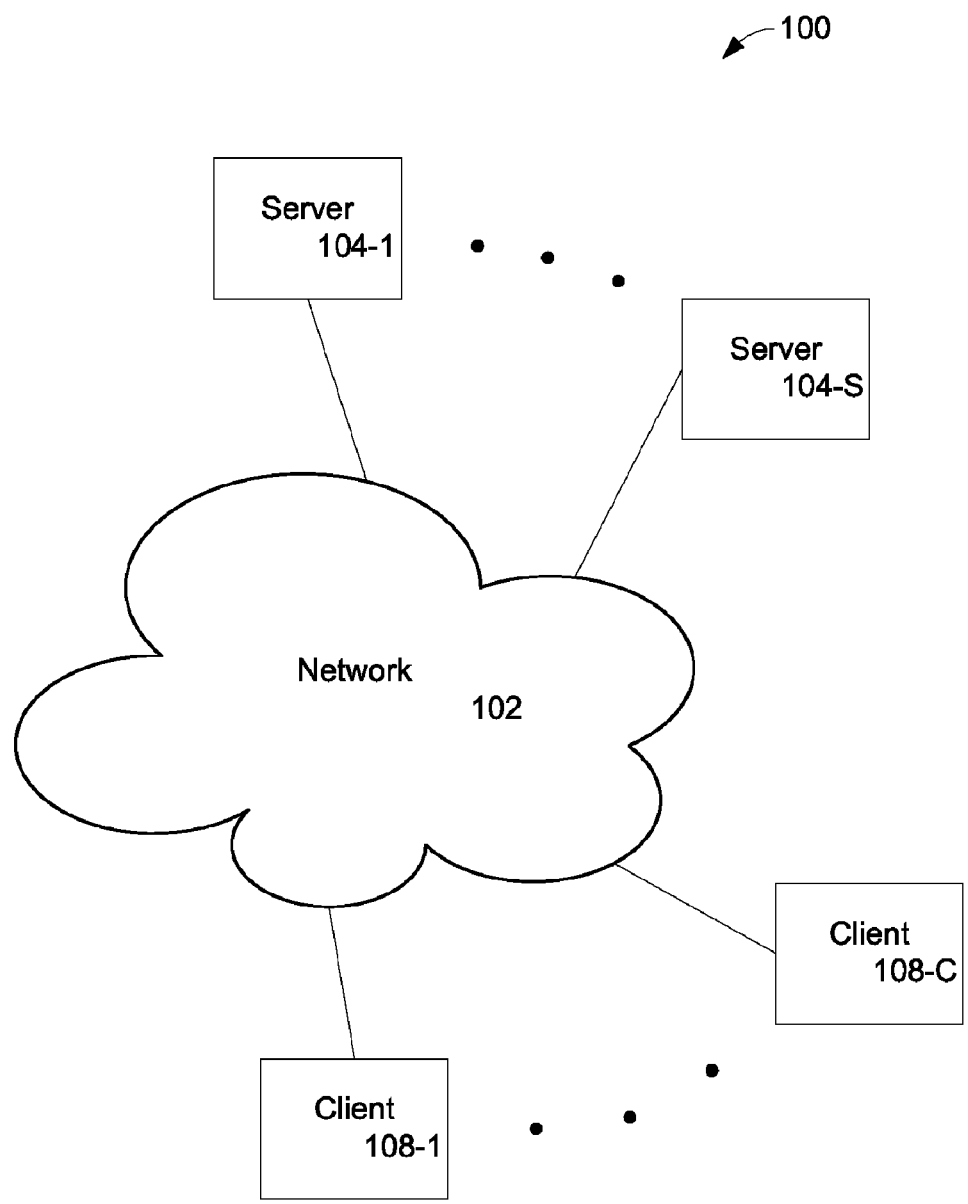
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
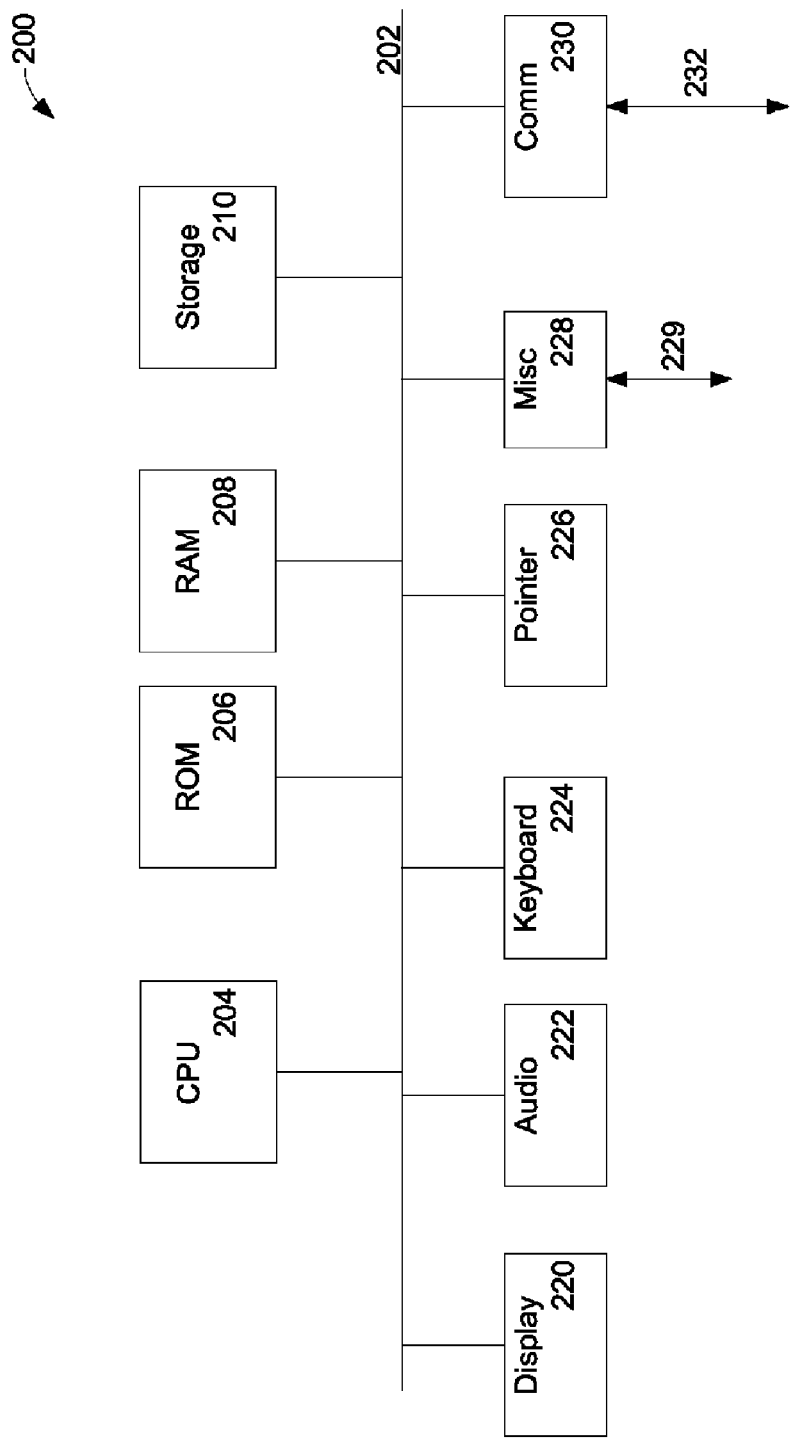
FIG. 2 is a block diagram of a computer system in which some embodiments of the invention may be used.
Figure 3:
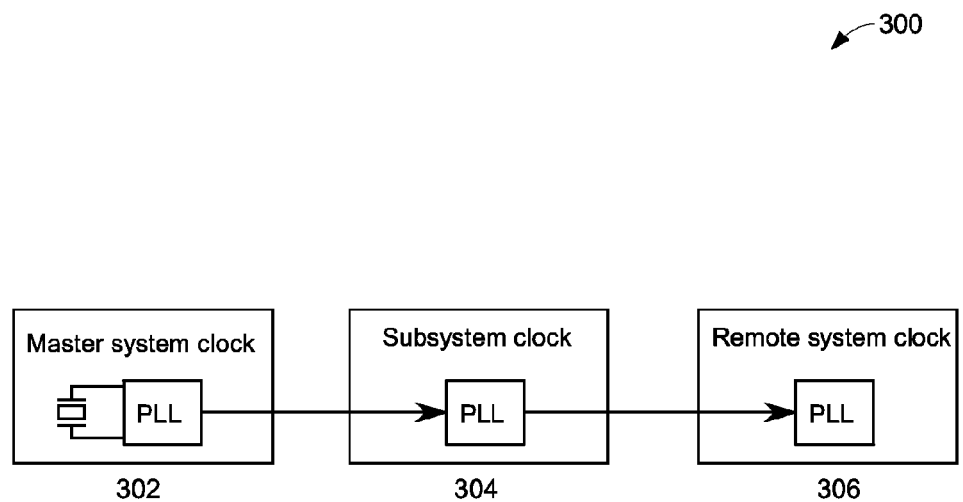
FIG. 3 shows a simplified block diagram of a system.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), HyperTransport (HT), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those of skill in the art to describe techniques and approaches. Furthermore, in the description, for purposes of explanation, numerous specific details are set forth in order to provide a thorough understanding of the present invention. It will be evident, however, to one of skill in the art that the present invention may be practiced without these specific details. In some instances, well-known structures and devices are shown in block diagram form, rather than in detail, in order to avoid obscuring the present invention. These embodiments are described in sufficient detail to enable those of skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory, and/or logic circuitry. These algorithmic descriptions and representations are the means used by those of skill in the arts to most effectively convey the substance of their work to others of skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

Further, any of the methods according to the present invention can be implemented in hard-wired circuitry, by programmable logic, or by any combination of hardware and software.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description, "Fast PLL Initialization", "initialization", or similar language refers to placing the PLL or DLL or FLL, or other locked loop, at an initial state that allows for a more rapid or quick lock. If the initialization is very precise lock may be substantially immediate. Thus fast PLL initialization may also be understood to be fast PLL lock, or alternatively fast PLL initialization and lock. The term lock or locked condition as well as capture range, track range, hold range, phase comparison, VCO, etc. are terms that are understood by one of skill in the art.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for fast PLL initialization have been described.

What is claimed is:
1. A method comprising:
receiving a phase locked loop (PLL) input signal;
receiving a PLL feedback signal, wherein said PLL feedback signal is selected from the group consisting of substantially a voltage controlled oscillator (VCO) output, and substantially said VCO output divided by N wherein N is an integer;
generating a comparison signal based on said received PLL input signal and said received PLL feedback signal;
generating a first control signal based on said comparison signal;
generating a second control signal based upon a prespecified value programmed into a register, wherein said prespecified value is selected from the group consisting of a substantially static value, a value determined at time of manufacture, a value loaded at power up, a value loaded at reset, a value loaded at a frequency change, a value loaded from a nonvolatile memory, a value loaded by a serial control chain, and a value loaded by a parallel control chain;
receiving a selection signal;
selecting either said first control signal or said second control signal based upon said received selection signal;
controlling said VCO (voltage controlled oscillator) by controlling three or more multiplexers based upon said selected control signal, wherein said VCO generates a VCO output, and wherein said three or more multiplexers control how many delay elements are in said VCO.

2. A method for initializing a phase locked loop (PLL) to a frequency comprising:
receiving a PLL clock input signal;
receiving a PLL feedback signal, wherein said PLL feedback signal is selected from the group consisting of substantially a voltage controlled oscillator (VCO) output, and substantially said VCO output divided by N wherein N is an integer;
generating a comparison signal based on said received PLL input signal and said received PLL feedback signal;
generating a first control signal based on said comparison signal;
generating a second control signal based upon a prespecified value programmed into a first register, wherein said prespecified value is selected from the group consisting of a substantially static value, a value determined at time of manufacture, a value loaded at power up, a value loaded at reset, a value loaded at a frequency change, a value loaded from a nonvolatile memory, a value loaded by a serial control chain, and a value loaded by a parallel control chain;
receiving a selection signal;
selecting either said first control signal or said second control signal based upon said received selection signal; and
controlling said frequency by controlling three or more multiplexers in said VCO wherein said controlling is via a second register, wherein said three or more multiplexers control how many delay elements are in said VCO, and wherein said PLL does not need a PLL input.

3. The method of claim 2 wherein said PLL can operate without receiving said PLL clock input signal.

4. An apparatus comprising:
a comparator having a reference signal input, a feedback input, and an output;
a first control circuit having an input and an output, said input in communication with said comparator output;
a second control circuit having an input and an output, said second control circuit input coupled to a first serial register, said second control circuit input capable of receiving communications for adjusting said second control circuit output;

a selection circuit capable of selecting either said first control circuit output or said second control circuit output; and a controllable oscillator having an input control and an output, said controllable oscillator input control in communication with said selected first control circuit output or said selected second control circuit output via said selection circuit, and said controllable oscillator output in communication with said comparator feedback input, and wherein said controllable oscillator is controlled by three or more multiplexers wherein said controlled is via a second register, wherein said three or more multiplexers control how many delay elements are in said VCO, and wherein said controllable oscillator does not need a frequency input.

5. The apparatus of claim 4 wherein said second control circuit further comprises a digital to analog converter (DAC) wherein said second control circuit output is an output of said DAC.

6. The apparatus of claim 4 wherein said second control circuit further comprises adjusting a number of delay elements in a ring oscillator of said controllable oscillator.

7. The apparatus of claim 4 wherein said second control circuit further comprises adjusting a delay loop of said controllable oscillator.

* * * * *